United States Patent

Chew et al.

[11] Patent Number: 5,821,556
[45] Date of Patent: Oct. 13, 1998

[54] SUPERCONDUCTIVE JUNCTION

[75] Inventors: Nigel Gordon Chew; Simon Wray Goodyear; Richard George Humphreys; Julian Simon Satchell, all of Malvern, United Kingdom

[73] Assignee: The Secretary of State for Defence in Her Britannic Majesty's Government of the United Kingdom of Great Britain and Northern Ireland, Hants, United Kingdom

[21] Appl. No.: 714,115

[22] PCT Filed: Mar. 10, 1995

[86] PCT No.: PCT/GB95/00525

§ 371 Date: Sep. 23, 1996

§ 102(e) Date: Sep. 23, 1996

[87] PCT Pub. No.: WO95/26575

PCT Pub. Date: Oct. 5, 1995

[30] Foreign Application Priority Data

Mar. 25, 1994 [GB] United Kingdom ................... 9406015

[51] Int. Cl.⁶ ............................ H01L 29/06; B32B 00/00
[52] U.S. Cl. .............................. 257/31; 257/34; 505/234; 505/238
[58] Field of Search ....................... 257/31, 34; 505/190, 505/234, 238, 329, 702

[56] References Cited

U.S. PATENT DOCUMENTS

| | | | |
|---|---|---|---|
| 4,224,630 | 9/1980 | Kroger | 257/34 |
| 4,263,603 | 4/1981 | Jillie, Jr. | 257/34 |
| 4,366,494 | 12/1982 | Ohta | 257/34 |
| 4,539,741 | 9/1985 | Ohta | 29/569 |

FOREIGN PATENT DOCUMENTS

| | | | |
|---|---|---|---|
| 62-122288 | 6/1987 | Japan | 257/34 |
| A63-102383 | 5/1988 | Japan . | |
| 64-37886 | 2/1989 | Japan | 257/34 |
| A01054772 | 3/1989 | Japan . | |
| 1-101677 | 4/1989 | Japan | 257/34 |
| A01077976 | 7/1989 | Japan . | |
| 2-213176 | 8/1990 | Japan | 257/34 |
| 5-90652 | 4/1993 | Japan | 257/34 |
| 5-90655 | 4/1993 | Japan | 257/34 |
| 1485655 | 9/1977 | United Kingdom . | |
| 2010625 | 6/1979 | United Kingdom . | |
| 1563981 | 4/1980 | United Kingdom . | |
| 2203009 | 10/1988 | United Kingdom . | |

*Primary Examiner*—Carl W. Whitehead, Jr.
*Attorney, Agent, or Firm*—Nixon & Vanderhye P.C.

[57] ABSTRACT

A superconductive junction (10) comprises a first track (22) of $YBa_2Cu_3O_7$ surmounted by a second track (28) also of $YBa_2Cu_3O_7$. An interconnect (26) in the form of a superconductive mesa electrically connects the first track to the second track and acts as a microbridge. When cooled below a critical temperature, the junction (10) shows Josephson-like behaviour. A non-superconductive layer (24) of $PrBa_2Cu_3O_7$ separates the first track and the second track, with the interconnect extending through the $PrBa_2Cu_3O_7$ layer in the form of an island. The junction (10) is fabricated by electron beam evaporation, optical lithography, and ion beam milling.

34 Claims, 5 Drawing Sheets

SUPERCONDUCTIVE JUNCTION

BACKGROUND OF THE INVENTION

1. Field of the Invention

The present invention relates to superconductive junctions and more particularly to superconductive junctions fabricated from a plurality of superconducting layers.

2. Discussion of Prior Art

Superconducting Josephson junctions fabricated from metal films are well known in the prior art and are reviewed by K. K. Likharev in Review of Modern Physics (1979), Volume 51, page 101 et seq.. Josephson junctions in metal superconductors conventionally comprise a tri-layer structure of superconductor, insulator, and superconductor, with the insulator forming a tunnel barrier. Microbridges comprising a link of constrained dimensions between two regions of a single layer of superconducting material are also known to produce junctions with Josephson-like properties. If a microbridge is of the order of the superconducting coherence length wide, an Anderson Dayem microbridge results. If a microbridge is of the order of the London penetration depth in size, the microbridge is known as a Likharev microbridge. The Josephson-like properties of a Likharev microbridge arise as a result of vortex flow rather than Josephson tunnelling. Josephson junctions incorporating tunnel barriers are distinguished from microbridges. Likharev microbridges are not true Josephson junctions but they do have many of the properties of Josephson junctions. The differences between Anderson Dayem microbridges in which the dimensions of the microbridge normal to a direction of current flow through the microbridge are comparable with the superconducting coherence length and Likharev microbridges in which the dimensions are comparable with the superconducting penetration depth are discused by Aslamazov and Larkin in Soviet Physics JETP (1975), Volume 41, Number 2, pages 381–386 and by others elsewhere.

U.S. Pat. No. 4,539,741 describes a Josephson junction element having a first layer of superconductor and a second layer of superconductor overlaying the first layer with an insulating layer disposed between the two superconducting layers. The two superconducting layers are electrically connected by a weak link which may be, inter alia, any kind of superconducting material, copper, or other normal metal. The weak link has a length equal to the thickness of the insulating layer in a range from a few hundred to a few thousand Å. The superconducting layers are made of superconducting metallic elements or their alloys. The width, length, and thickness of the weak link are such that an Anderson Dayem microbridge results with a sin $\phi$ current phase characteristic.

Oxide superconductors having critical temperatures higher than those of metals or intermetallic compounds were discovered in 1986. The term critical temperature in the field of superconductivity means the temperature at which a material loses all electrical resistivity. The fabrication of reliable reproducible Josephson junctions in thin films of oxide superconductors is less straightforward than the fabrication of junctions in metal superconductors. The difficulties arise from the conditions required to deposit the thin films, the superconducting parameters of the oxide superconductors, and their physical and chemical sensitivity to processing techniques.

A variety of techniques for fabricating Josephson junctions in oxide superconductors have been described in the literature. Grain boundary junctions may be formed by patterning tracks into a superconducting film deposited over a grain boundary of a substrate, as described by D. Dimos et at. in Physical Review Letters (1988), Volume 61, page 2476 et seq. Grain boundary junctions may also be fabricated by depositing a superconducting film over a step in a substrate. Grain boundary junctions do not have sufficient reproducibility for use other than in the most simple electrical circuits. Attempts have been made to fabricate tri-layer junctions incorporating an insulating tunnel barrier layer though these have not been successful. The tunnel barrier must be very thin, of the order 20 Å, and is susceptible to pin-holes.

It is not practical to attempt to fabricate an Anderson Dayem microbridge in oxide superconductors since the junction would have to be a few Å in size which is too small for conventional fabrication techniques.

Likharev microbridges in thin films of oxide superconductors have been obtained by patterning a narrow constriction into the film using electron-beam lithography or ion milling, the width restraint on the constriction being eased by thinning the film in the region of the microbridge. Such microbridges are susceptible to oxygen loss which may catastrophically affect their performance.

SUMMARY OF THE INVENTION

It is an object of the invention to provide an alternative form of superconductive junction.

The present invention provides a superconductive junction having Josephson junction-like properties when cooled below a critical temperature comprising a first superconductive oxide layer epitaxial with a substrate and a second epitaxial superconductive oxide layer electrically connected to the first layer by a superconductive microbridge, characterized in that the second layer includes a region extending over a region of the first layer and the microbridge connects the regions.

The invention provides the advantage of being a microbridge Josephson-like junction in which the superconductive layers are arranged sequentially in a multi-layer structure, the junction thus being better protected from degradation due to contamination by its surrounding environment.

The superconductive junction may be arranged so that the microbridge is a Likharev microbridge. The junction may be arranged so that the Josephson-junction like properties arise as a result of a coherent motion of superconducting vortices through the microbridge. The term superconducting vortex is a standard term in superconductivity referring to supercurrents circulating around quanta of magnetic flux. The microbridge may have dimensions comparable with a superconducting penetration depth.

The superconductive layers may be of the same oxide material with no grain boundaries between the superconductive layers. The oxide superconductor may be tetragonal or orthorhombic with a longest crystallographic repeat vector normal to a planar interface between the substrate and the first superconductive layer.

A non-superconductive layer may extend at least partially between the two superconductive layers. This non-superconductive layer may have non-metallic physical characteristics and it may be an oxide layer. The superconductive layers may be a rare earth barium copper oxide, in which the rare earth may be yttrium and the non-superconductive layer may be praseodymium barium copper oxide. The junction may incorporate a c-axis microbridge, in which the microbridge is arranged so that the crystallographic c-axis is substantially parallel to the direction of current flow through the microbridge.

In a preferred embodiment the microbridge is surrounded by the non-superconductive layer. In another embodiment, the microbridge is an edge microbridge, connecting the first and second superconductive layers at an edge of the layers rather than internally. The junction of the invention may be incorporated in a superconducting quantum interference device or in another electrical circuit.

BRIEF DESCRIPTION OF THE DRAWINGS

In order that the invention might be more fully understood, examples thereof will now be described, by way of example only, with reference to the accompanying drawings, in which.

DETAILED DISCUSSION OF PREFERRED EMBODIMENTS

Figure 1:
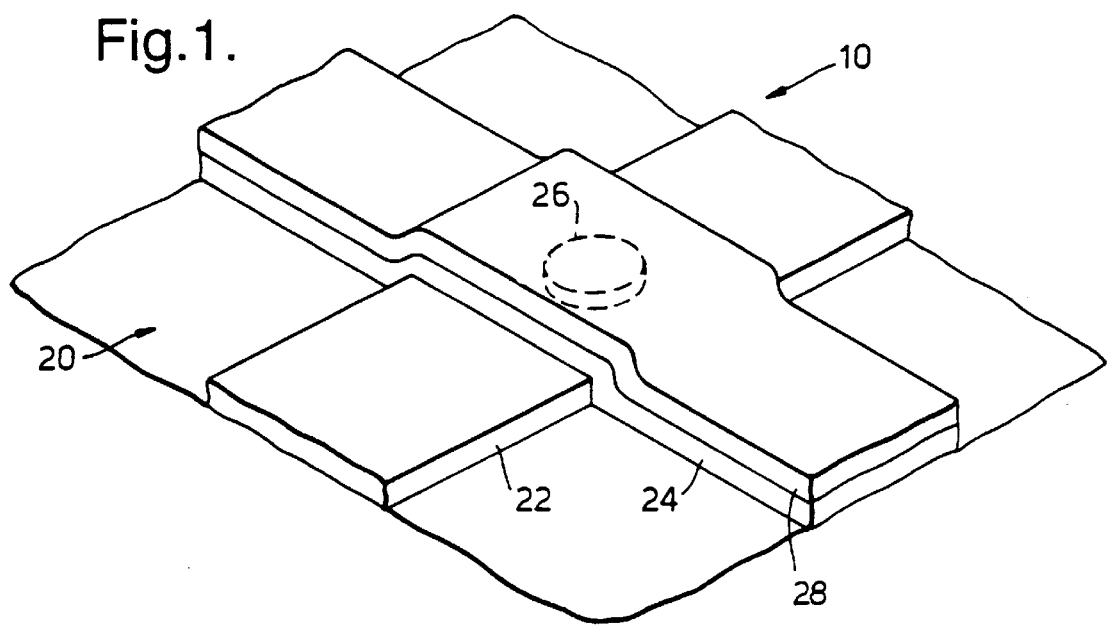
FIG. 1 shows a superconductive junction of the invention in perspective.

Referring to FIG. 1, there is shown a schematic view of a superconductive junction of the invention indicated generally by 10. The junction 10 is fabricated on substantially a single crystal substrate of MgO 20 and comprises a first track 22 of epitaxial $YBa_2Cu_3O_7$ An insulating region 24 of $PrBa_2Cu_3O_7$ overlies and extends transversely across the first track 22. The region 24 surrounds a mesa 26 of $YBa_2Cu_3O_7$. A second track $YBa_2Cu_3O_7$ 28, epitaxial with the first track 22 covers the $PrBa_2Cu_3O_7$ region 24 and the mesa 26.

Figure 2A:
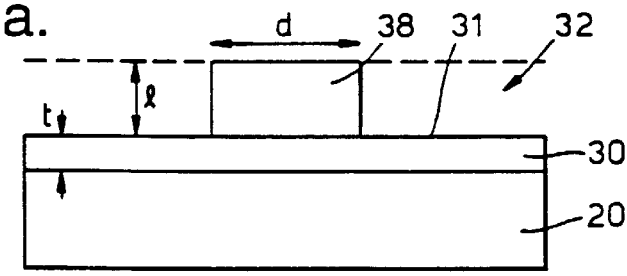
FIGS. 2a–2e show sectional side views of stages in the fabrication of the junction of FIG. 1.

Referring now to FIGS. 2a–2e, there are shown stages 2a to 2e in the fabrication of the junction 10 of FIG. 1. FIG. 2a shows the substrate 20 with a layer of $YBa_2Cu_3O_7$ 30 superposed on the substrate 20. The $YBa_2Cu_3O_7$ layer 30 is deposited on the substrate 20 using an electron beam evaporation method described by N. G. Chew et al. in Applied Physics Letters, Volume 57 Number 19, November 1990, pages 2016 to 2018. The layer 30 has a crystallographic orientation with the c-axis of the layer normal to the plane of the substrate which is (001) oriented. The crystallographic c-axis of $YBa_2Cu_3O_7$ is parallel to the longest lattice repeat vector of the orthorhombic unit cell which has a magnitude of approximately 11.7 Å. The layer 30 has a thickness, t, of 0.7 $\mu$m. Prior to the deposition of all oxide layers, the sample receives a short argon ion-beam mill in situ to clean the surface onto which the oxide layer is to be deposited. This ion mill is carried out at an accelerating potential of 500 V for 3 minutes, followed by 2 minutes at 300 V. Following deposition of the layer 30, AZ1518 positive photoresist is spun onto an upper surface 31 of the layer 30 to leave a layer 32 of photoresist of thickness 1.7 $\mu$m.

Figure 2B:
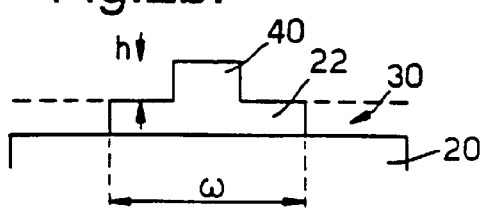

In a first optical lithography process, the layer 32 is exposed to ultraviolet light and developed, to leave a circular region 38 having a diameter, d, of 3 pm. The area of the layer 30 which is not covered by the region 38 is then subjected to ion-beam milling. In the ion-beam milling process $Ar^+$ ions are used to ablate the sample. The $Ar^+$ ions are accelerated with an accelerating potential of 500 V and a beam current of 12 mA, corresponding to an ion current density of approximately 0.4 mA/cm². The substrate 20 is clipped to a rotating cooled platen, and the ion-beam is normal to the substrate. The milling proceeds until the area of the layer 30 which is not covered by the photoresist region 38 is thinned to a thickness of 0.2 $\mu$m The area of the $YBa_2Cu_3O_7$ layer 30 beneath the resist region 38 is not thinned. Following the ion-beam milling, the remaining photoresist is removed using a standard oxygen plasma ashing process. This lithography process leaves a mesa 40 of $YBa_2Cu_3O_7$ having a height, h, of 0.5 $\mu$m as shown in FIG. 2b.

Figure 2C:
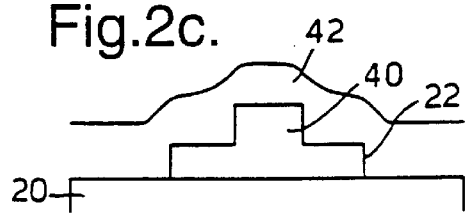

The thinned $YBa_2Cu_3O_7$ layer 30 is then patterned in to the track 22 which has a width w of 20 $\mu$m. To achieve this patterning, a second layer of photoresist is deposited over the layer 30 and the mesa 40. The photoresist covering the surplus $YBa_2Cu_3O_7$ is exposed to UV light, the resist is developed, and the surplus $YBa_2Cu_3O_7$ removed by ion-beam milling. The ion-beam milling is carried out as for the patterning of the mesa 40 except that the ion beam is at a 45° angle of incidence to the substrate. An epitaxial layer 42 of $PrBa_2Cu_3O_7$ with an approximate thickness of 0.4 $\mu$m is then deposited over the mesa 40, the track 22 and the substrate 20 by electron beam evaporation in a similar manner to the $YBa_2Cu_3O_7$ layer 30, as shown in FIG. 2c. A photoresist layer is then spun on to the substrate as previously, to give a photoresist thickness of approximately 1.7 $\mu$m. The resist planarises the sample surface and has a ion-beam milling rate close to that of $YBa_2Cu_3O_7$ and $PrBa_2Cu_3O_7$.

Figure 2D:
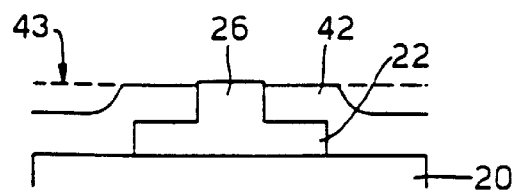

The composite structure of substrate, $YBa_2Cu_3O_7$, $PrBa_2Cu_3O_7$, and photoresist is subjected to an ion-beam milling process as previously described at a 45° angle of incidence. Since the composite structure has an initial approximately planar surface and the milling rates of resist, $YBa_2Cu_3O_7$, and $PrBa_2Cu_3O_7$ are approximately equal, the planar surface is preserved during the milling process. The milling proceeds until a desired end-point is detected using secondary ion mass spectrometry (SIMS), as described by R. G. Humphreys et al. in Applied Physics Letters, Volume 61 Number 2, July 1992, pages 228 to 230. The desired end-point is reached when a praseodymium signal is first detected by the SIMS apparatus. The SIMS apparatus is not sufficiently sensitive to detect the small amount of $PrBa_2Cu_3O_7$ removed from above the mesa 40. The detected end-point corresponds to the onset of the $PrBa_2Cu_3O_7$ surrounding the mesa 40 being milled away. Any remaining photoresist which has not been removed by the ion milling process is removed by plasma ashing as previously. The resulting structure is shown in FIG. 2d. The mesa 40 has been reduced in height to form the mesa 26. The height of the mesa 26 is equal to the thinned thickness of the $PrBa_2Cu_3O_7$ layer 42, and the surface of the $PrBa_2Cu_3O_7$ layer 42 above the track 22 and that of the exposed $YBa_2Cu_3O_7$ mesa 26 lie approximately in a common plane 43. Since the top surface of the photoresist may not be exactly planar and the milling rates are not exactly equal, the exposed surface of the mesa 26 may be proud of the plane 43 by up to 20 nm.

Figure 2E:
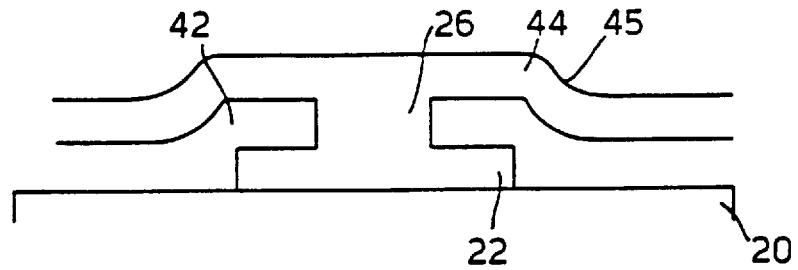

A second layer 44 of $YBa_2Cu_3O_7$ is deposited epitaxially on top of the mesa 26 and the $PrBa_2$ $Cu_3O_7$ layer 42, as shown in FIG. 2e. The second layer 44 has a thickness of 0.35 $\mu$m. The second layer 44 is patterned to form the second track 28 as shown in FIG. 1 using the previously described technique of photolithography and ion milling. The second track 28 is protected from milling by a strip of photoresist, and the milling proceeds until an yttrium or magnesium signal is measured by the SIMS apparatus, corresponding to removal of the $PrBa_2Cu_3O_7$ layer 42 from everywhere except beneath the second track 28, where it forms the insulating region 24. The photoresist is then removed by plasma ashing. There is a step 45 in the the second layer 44 but this step does not give rise to a Josephson junction. Crossover tracks of $YBa_2Cu_3O_7$ which do not give rise to Josephson junctions when crossing over lower $YBa_2Cu_3O_7$ tracks insulated by a $PrBa_2Cu_3O_7$ barrier are described by M. N. Keene et al. in Applied Physics Letters, Volume 64 Number 3, January 1994 pages 366 to 368.

The mesa 26 forms a superconducting link between the track 22 and the track 28, forming the junction 10 which acts as a Josephson junction. Electrical contacts to the junction are fabricated using a conventional lift-off process in which silver, gold, or a silver-gold alloy is evaporated on to the sample. In a final processing step, the sample is annealed at 550° C. in flowing oxygen for 1 hour, followed by a 5°/min cool down period.

Figure 3A:
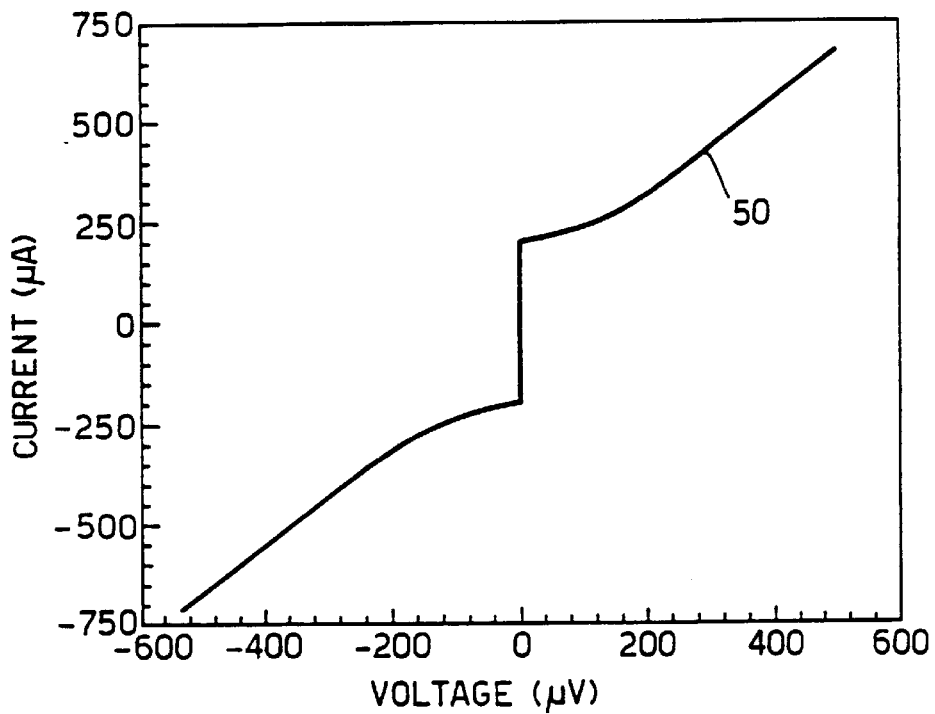
FIGS. 3a–3b show graphs of physical characteristics displayed by junctions similar to the FIG. 1 junction.
Figure 3B:
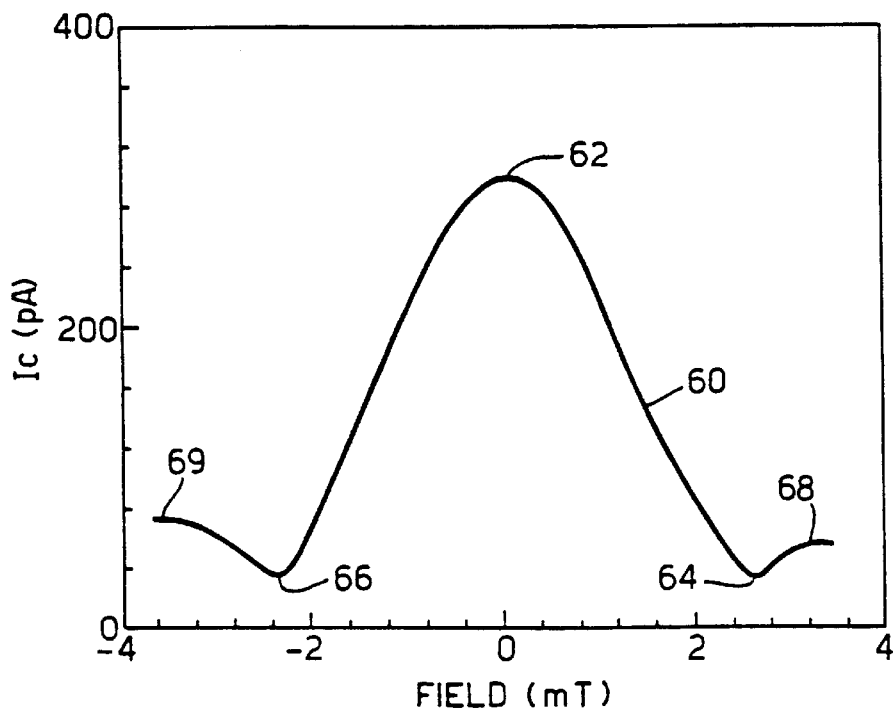

Referring now to FIGS. 3a to 3d there are shown graphs of the physical characteristics of superconductive junctions similar to the junction 10. FIG. 3a shows a current voltage characteristic 50 of a junction with a 3 $\mu$m diameter mesa measured at 70.2K (-203° C.) in zero applied magnetic field. FIG. 3b shows the magnetic field dependence of the critical current, Ic, of a junction with a 3 $\mu$m diameter mesa measured at 77.2K (-196° C.) with the applied magnetic field being parallel to the plane of the substrate and normal to the flow of current across the mesa. The critical current of a junction is the maximum current which can be passed through the junction without a potential difference of greater than 1 $\mu$V being measured. The junction has a characteristic 60 which shows a central critical current maximum 62 with minima 64 and 66 on either side. The characteristic 60 also shows subsidiary maxima 68 and 69. Analysis indicates that these characteristics are not compatible with a sinusoidal current-phase relationship.

Figure 3C:
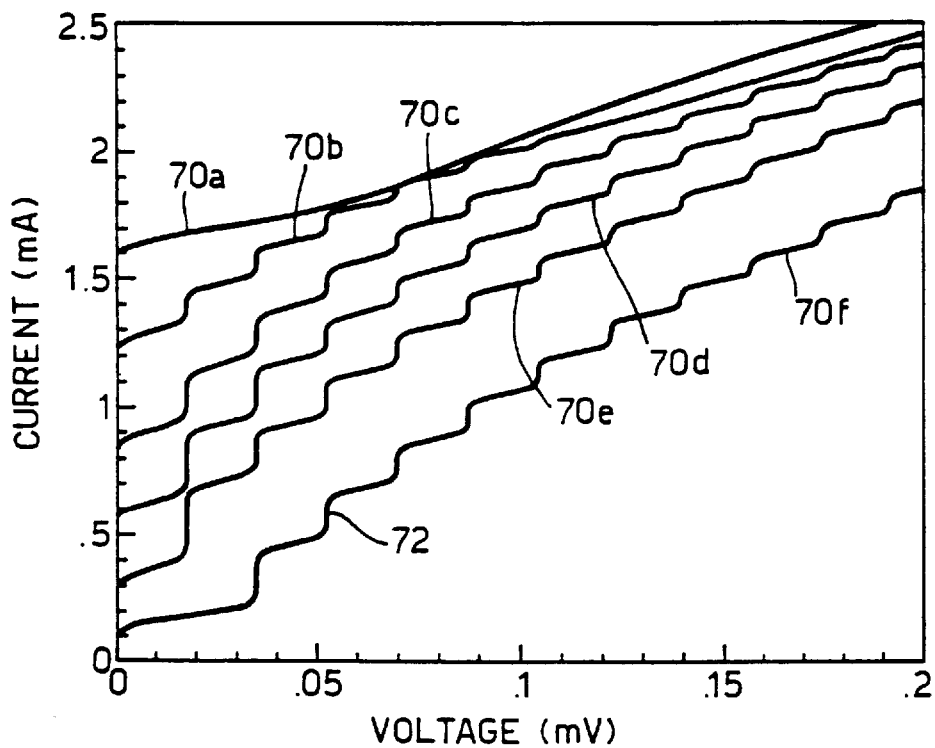

FIG. 3c shows the effect of microwave radiation on the current voltage characteristics of a junction having a 4 $\mu$m diameter mesa measured at 60K (-213° C.). The figure shows a series of characteristics 70a to 70f measured with an increasing microwave power density, the microwave radiation having a frequency of 8.48 GHz. Apart from the characteristic 70a, measured at zero incident power, the characteristics 70b to 70f each show Shapiro steps such as step 72 at regular voltage increments of approximately 20 $\mu$V.

Figure 3D:
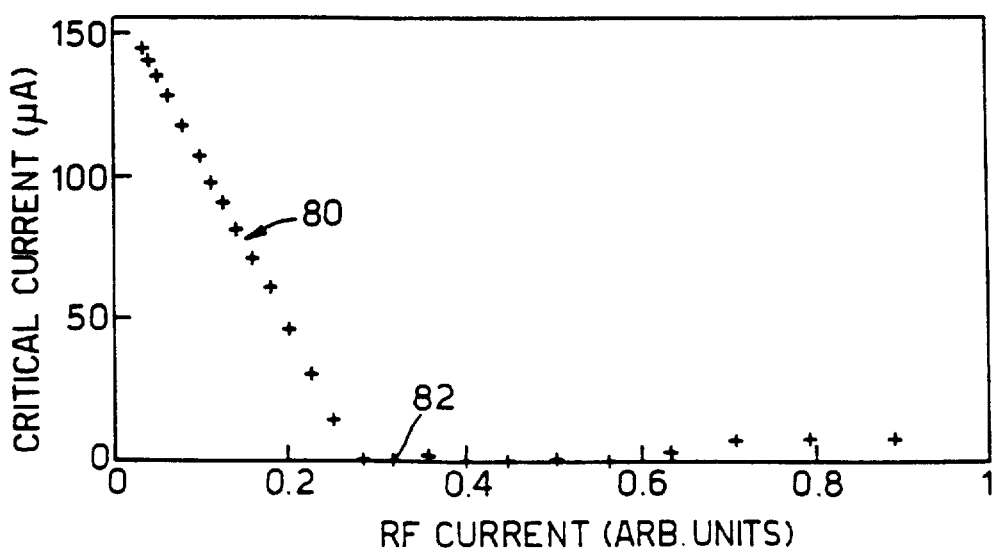

FIG. 3d shows the variation of critical current of a junction having a 4 $\mu$m diameter mesa with applied microwave radiation power of frequency 8.21 GHz. measured at 75K (-202° C.). FIG. 3d is a graph of critical current against the RF current, which is proportional to the square root of the microwave radiation power. The graph shows an initial linear dependence of critical current on RF current, indicated by 80, with the critical current falling to zero, indicated by 82, as the RF current increases.

For the junction 10 to show Josephson-like behaviour, the height of the mesa 26 parallel to the direction of current flow along the mesa should be comparable with the a-b plane penetration depth, which is approximately 0.3 $\mu$m at 77K (-196° C.). Consideration of the fabrication process indicates an optimum height of the mesa 26 of about 0.4 $\mu$m, although Josephson-like properties are expected for junctions having mesas of heights up to approximately 1 $\mu$m. The minimum mesa height is determined by the desired junction strength, the need to avoid pin-holes in the insulator, and the capacitance and leakage resistance of the insulator. The mesa height could be as low as 5 nm. To produce a Likharev microbridge, the width of the mesa 26 perpendicular to the direction of current flow should be of the order of the c-axis penetration depth, which is approximately 0.7$\mu$m at 77K (-196° C.); if the mesa is less than the penetration depth wide but of the order of the coherence length wide, an Anderson Dayem microbridge may result. In experiments, junctions having a mesa diameter of up to 10 $\mu$m have shown Josephson-like behaviour. Whilst the fabrication of a junction having a circular mesa has been described, the junction 10 may comprise a mesa 26 which is not circular. The mesa 26 may have a variety of shapes including but not limited to square, rectangular, and elliptical.

Whilst the junction 10 has been described with superconductive layers of $YBa_2Cu_3O_7$, the composition of the layers may not, be exactly stoichiometric. It is known that slight changes in composition have an effect on the superconducting properties of $YBa_2Cu_3O_7$, as described by N. G. Chew et al. in Applied Physics Letters, Volume 57 Number 19, November 1990, pages 2016 to 2018. Rare earth barium copper oxides other than yttrium barium copper oxide are known to superconduct and such materials may also be suitable as replacements for the $YBa_2Cu_3O_7$. The $PrBa_2Cu_{37}$ layer may be replaced by other non-superconductive materials, for example $Y_2O_3$, $La_{1.5}Ba_{1.5}Cu_3O_7$, or $CeO_2$. The resistivity of the $PrBa_2Cu_3O_7$ layer may be increased by the addition of a dopant species.

Substrates other than MgO may be used, for example $SrTiO_3$ and $LaAlO_3$. The selection of substrate is determined by its suitability for growing epitaxial layers of $YBa_2Cu_3O_7$ or $PrBa_2Cu_3O_7$. Buffer layers may be deposited prior to the deposition of the first layer of $YBa_2Cu_3O_7$. Methods of planarisation other than ion-beam milling may be possible within the scope of the invention. It may be possible to use a combination of an anisotropic etch such as bromine in ethanol combined with mechanical action, as in chemo-mechanical processing, similar techniques being used for planarising integrated semiconductor circuits. The planarisation may also be achieved by physically polishing the surface. Workers skilled in the art of micro-circuit lithographic processing are familiar with these procedures and will be able to perform simple tests to determine their applicability.

Figure 4:
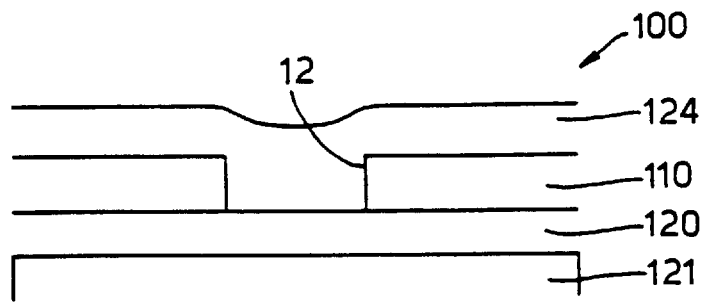
FIG. 4 is a sectional side view of another superconductive junction of the invention.

FIG. 4 shows a cross-section of a c-axis microbridge superconductive junction 100 fabricated by a second method. Rather than fabricating a mesa prior to the deposition of a $PrBa_2Cu_3O_7$ insulating layer, the junction 100 is fabricated by depositing an epitaxial $PrBa_2Cu_3O_7$ layer 110 onto a planar epitaxial $YBa_2Cu_3O_7$ base layer 120 deposited on a MgO substrate 121. A photolithographically defined window 122 in the $PrBa_2Cu_3O_7$ layer 110 is then opened by ion-beam milling down to the $YBa_2Cu_3O_7$ layer 120. A top layer 124 of epitaxial $YBa_2Cu_3O_7$ is then deposited over the $PrBa_2Cu_3O_7$ layer 110 so as to contact the base layer 120 through the window 122.

Figure 5:
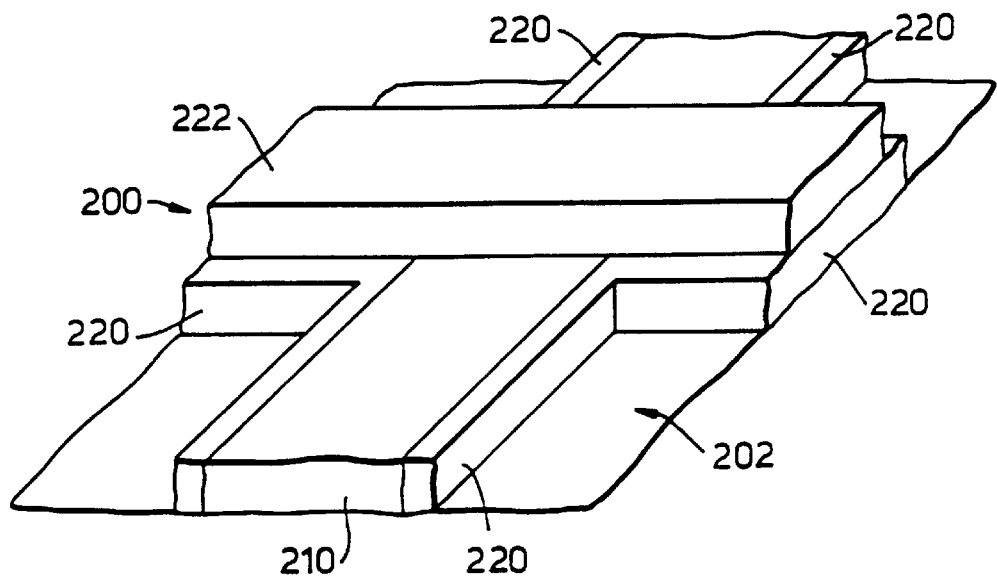
FIG. 5 shows a schematic perspective view of a further superconductive junction of the invention.

FIG. 5 shows a schematic view of a c-axis microbridge superconductive junction 200 fabricated by a third method. An epitaxial layer of $YBa_2Cu_3O_7$ (not shown) is deposited on a MgO substrate 202 and patterned into a 3 $\mu$m wide track 210. A layer of epitaxial $PrBa_2Cu_3O_7$ 220 is deposited over the track 210 and planarised as previously to expose the track 210. A second layer of epitaxial $YBa_2Cu_3O_7$ is deposited over the $PrBa_2Cu_3O_7$ 220 and the track 210 and patterned by photolithography and ion-beam milling into a second track 222 which crosses the track 210. The ion-beam milling is terminated upon the measurement of a praseodymium signal by the SIMS apparatus. In a final processing stage, the excess $PrBa_2Cu_3O_7$ covering the major part of the substrate is removed by ion-beam milling.

Figure 6:
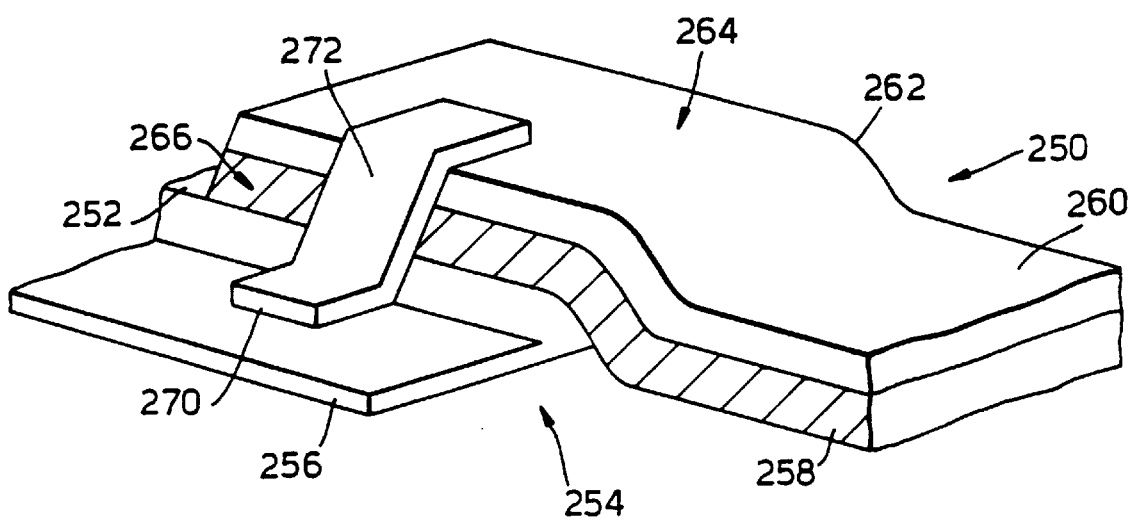
FIG. 6 shows a schematic perspective view of a further superconductive junction of the invention.

Referring now to FIG. 6 there is shown a c-axis microbridge 250 fabricated by a fourth method. A planar epitaxial $YBa_2Cu_3O_7$ base layer 252 is deposited on an MgO substrate 254 and patterned by photolithography and ion beam milling to form a base electrode 256. An epitaxial $PrBa_2Cu_3O_7$ layer 258 is then deposited epitaxially over the base layer and a second epitaxial $YBa_2Cu_3O_7$ layer 260 is deposited over the $PrBa_2Cu_3O_7$ layer 258. The second $YBa_2Cu_3O_7$ layer 260 and the $PrBa_2Cu_3O_7$ layer 258 are then patterned to form a top electrode 262 which includes a region 264 which overlaps the base electrode 256. An edge 266 is then defined by photolithography and ion beam milling. The second $YBa_2Cu_3O_7$ layer 260, the $PrBa_2Cu_3O_7$ layer 258 are milled through and the base electrode 256 is partially milled away. A third epitaxial $YBa_2Cu_3O_7$ layer 270 is then deposited over the second $YBa_2Cu_3O_7$ layer 260, the base electrode 256 and the exposed substrate 254. Most of the third $YBa_2Cu_3O_7$ layer 270 is milled away to leave a small region 272 connecting the base electrode 256 to the second $YBa_2Cu_3O_7$ layer 260. This region acts as a Likharev microbridge. This method provides the advantage of enabling the fabrication of devices which have a dimension normal to the c-axis which is of the order of the thickness of the third $YBa_2Cu_3O_7$ layer.

Figure 7:
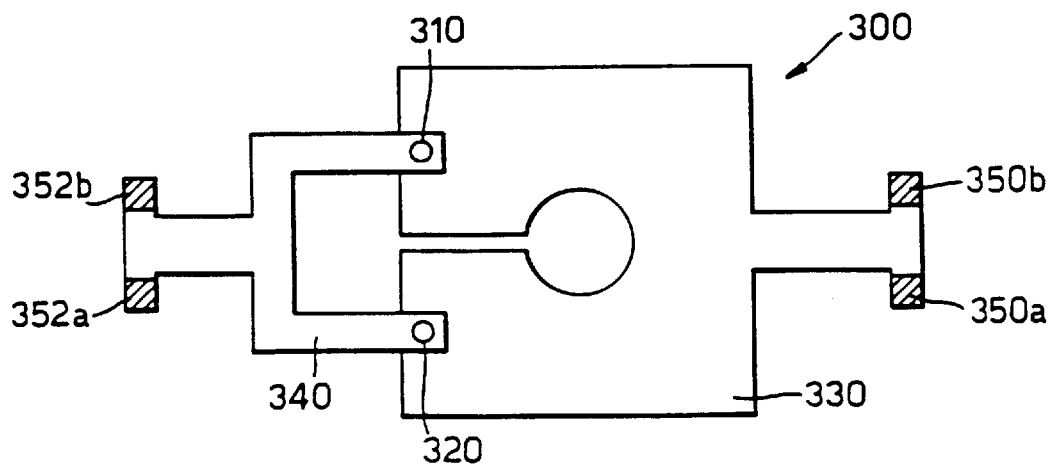
FIG. 7 shows in a plan view a SQUID incorporating two superconductive junctions of the invention.

Referring now to FIG. 7 there is shown a superconducting quantum interference device (SQUID) 300 comprising two superconductive junctions 310 and 320. The junctions 310 and 320 are fabricated in a similar manner to the junction 10. The junctions 310 and 320 are superconductively connected together by an $YBa_2Cu_3O_7$ base layer 330 and a $YBa_2Cu_3O_7$ top layer 340. The base layer 330 is patterned into a washer-type configuration and electrical connection is made to the base layer 330 by contacts 350a and 350b and to the top layer 340 by contacts 352a and 352b.

In certain applications, it is desirable to reduce the inductance of a circuit which includes a Josephson junction. The junction 10 may be included as part of a logic circuit in which a high switching speed is desired. A junction in which the c-axes are aligned in the plane of the substrate will have a higher sheet inductance for one in which the layers are arranged with the c-axes normal to the substrate, unless the circuit has a one dimensional wiring layout.

We claim:

1. A superconductive junction having properties of a Josephson junction when cooled below a critical temperature, comprising;
   a first superconductive oxide layer epitaxial with a substrate (202);
   a second epitaxial superconductive oxide layer epitaxial with said first layer;
   a superconductive microbridge electrically connecting said layers; and
   a region in said second layer extending over a region in said first layer, and said microbridge connects the regions.

2. A superconductive junction according to claim 1 wherein the microbridge is comprised of a Likharev microbridge.

3. A superconductive junction according to claim 1 wherein the microbridge has dimensions such that properties of a Josephson junction are due to a coherent motion of superconducting vortices through the microbridge.

4. A superconductive junction according to claim 1 wherein the microbridge has a cross-section normal to a direction of current flow through the microbridge having dimensions within an order of magnitude of a superconducting penetration depth parallel to the direction of current flow through the microbridge.

5. A superconductive junction according to claim 1 wherein the superconductive layers and the superconductive microbridge are of the same superconductive oxide material and there is no grain boundary between either of the layers and the microbridge.

6. A superconductive junction according to claim 5 wherein the superconductive layers have anisotropic superconductive properties.

7. A superconductive junction according to claim 6 wherein a superconducting penetration depth parallel to a direction of current flow through the microbridge is greater than a superconducting penetration depth perpendicular to the direction of current flow.

8. A superconductive junction according to claim 7 wherein the superconductive layers have a tetragonal crystallographic unit cell.

9. A superconductive junction according to claim 7 wherein the superconductive layers have an orthorhombic crystallographic unit cell.

10. A superconductive junction according to claim 9 wherein the layers are substantially single crystal and that the longest crystallographic lattice repeat vector of the layers is substantially normal to a planar interface between the substrate and the first layer.

11. A superconductive junction according to claim 10 wherein the microbridge has a cross section normal to the direction of current flow through the microbridge which has a dimension which is greater than the superconducting coherence length and less than 7 $\mu$m.

12. A superconductive junction according to claim 5 wherein a non-superconductive layer extends at least partially over the first superconductive layer and at least partially between the two superconductive layers.

13. A superconductive junction according to claim 12 wherein the non-superconductive layer has non-metallic physical characteristics.

14. A superconductive junction according to claim 13 wherein the non-superconductive layer is an oxide layer.

15. A superconductive junction according to claim 14 wherein the superconductive layers are layers of a rare earth barium copper oxide.

16. A superconductive junction according to claim 15 wherein the first and the second superconductive layers are layers of yttrium barium copper oxide.

17. A superconductive junction according to claim 16 wherein the non-superconductive layer is a layer of epitaxial praseodymium barium copper oxide.

18. A superconductive junction according to claim 17 wherein the layers have a crystallographic c-axis which s substantially normal to a planar interface between the substrate and the first superconductive layer and substantially parallel to a direction of current flow through the microbridge.

19. A superconductive junction according to any one of claim 12 wherein the microbridge between the first and second superconductive layers is surrounded by the non-superconductive layer.

20. A superconductive layer according to claim 19 wherein the microbridge has a dimensions perpendicular to a direction of current flow through the microbridge which are less than 7 μm.

21. superconductive junction according to claim 20 wherein the microbridge has a dimension parallel to the direction of current flow through the microbridge which is greater than 5 nm and less than 1 μm.

22. A superconductive junction according to claim 12 wherein the microbridge is an edge microbridge.

23. A superconducting quantum interference device comprising a plurality of superconductive junctions according to claim 1.

24. An electrical circuit including a superconductive junction according to claim 1.

25. A method of fabricating a superconductive junction according to claim 1 wherein said method comprises the steps of:
   (i) depositing a first epitaxial layer of oxide superconductor on a substrate;
   (ii) selectively thinning the first layer of oxide superconductor to form a mesa;
   (iii) epitaxially depositing a layer of non-superconductive oxide over the first layer of superconductor and the mesa;
   (iv) thinning the non-superconductive oxide layer to expose the mesa; and
   (v) epitaxially depositing a second layer of oxide superconductor over the non-superconductive oxide layer and the exposed mesa.

26. A method of fabricating a superconductive junction according to claim 1 wherein said method comprises the steps of:
   (i) depositing a first epitaxial layer of oxide superconductor on a substrate;
   (ii) epitaxially depositing a layer of non-superconductive oxide over the first layer of superconductor;
   (iii) forming a window through the non-superconductive oxide layer to expose the first layer of superconductor; and
   (iv) epitaxially depositing a second layer of oxide superconductor over the non-superconductive oxide layer and the exposed first layer of superconductor.

27. A method of fabricating a superconductive junction according to claim 1 wherein said method comprises the steps of:
   (i) depositing an epitaxial layer of oxide superconductor on a substrate;
   (ii) patterning the superconductor to form a first track;
   (iii) epitaxially depositing a layer of non-superconductive oxide over the first track and the substrate;
   (iv) planarisation of the non-superconductive oxide to expose the first track;
   (v) epitaxially depositing a second layer of oxide superconductor over the non-superconductive oxide and the exposed first track; and
   (vi) patterning the second superconductor layer to form a second track crossing the first track and contiguous to it.

28. A method of fabricating a superconductive junction according to claim 1 wherein said method comprises the steps of:
   (i) depositing a first epitaxial layer of oxide superconductor on a substrate;
   (ii) patterning the first layer to form a base electrode;
   (iii) epitaxially depositing a layer of non-superconductive oxide over the base electrode and a second layer of oxide superconductor over the non-superconductive oxide layer;
   (iv) patterning the layers to form an edge;
   (v) epitaxially depositing a third layer of oxide superconductor in contact with the edge; and
   (vi) patterning the third layer to leave the microbridge electrically connecting the first layer and the second layer.

29. A superconductive junction comprising:
   a first superconductive oxide layer epitaxial with a substrate;
   a second superconductive oxide layer epitaxial with said first layer; and
   a superconductive microbridge electrically connecting said first layer to said second layer, said second layer having a region which extends over a region of said first layer and said microbridge connecting said regions, wherein said superconductive junction is of such a size that when said junction is cooled below a critical temperature said junction has characteristics of a Josephson junction.

30. A superconductive junction comprising:
   a first superconductive oxide layer epitaxial with a substrate;
   a second superconductive oxide layer epitaxial with said first layer;
   a superconductive microbridge of superconductive oxide material epitaxial with said first and second layers and electrically connecting said first and second layers; and
   an insulating layer of doped or undoped praseodymium barium copper oxide extending between said first and second layers and being bridged by said microbridge; wherein said first and second layers have anisotropic superconductive properties and said first and second layers are substantially single crystal, with the longest crystallographic lattice repeat vector of the layers substantially normal to the planar interface between said substrate and said first layer, and wherein said microbridge has a cross section normal to the direction of current flow through said microbridge which is greater than the superconducting coherence length and less than 7 μm.

31. A superconductive junction comprising:
   a first superconductive oxide layer epitaxial with a substrate;
   a second superconductive oxide layer epitaxial with said first layer;
   a non-superconducting layer extending between said first and second layers, and a superconductive oxide microbridge electrically connecting said first layer to said second layer, said second layer having a region which extends over a region of said first layer and said microbridge connecting said regions, wherein said superconductive junction is of such a size that when said junction is cooled below a critical temperature said junction has characteristics of a Josephson junction, and wherein said microbridge of superconducting oxide comprises a projection extending above said first layer and is surrounded by said non-superconducting layer so as to have no exposed sides of said projection.

32. A superconductive junction comprising:
   a first superconductive oxide layer epitaxial with a substrate;
   a second superconductive oxide layer epitaxial with said first layer;
   a superconductive microbridge of superconductive oxide material epitaxial with said first and second layers and electrically connecting said first and second layers; and an insulating layer of doped or undoped praseodymium barium copper oxide extending between said first and second layers and being epitaxial with said layer, said insulating layer being bridged by said microbridge; wherein said first and second layers have anisotropic superconductive properties and said first and second layers are substantially single crystal, with the longest crystallographic lattice repeat vector of the layers substantially normal to the planar interface between said substrate and said first layer and substantially parallel to a direction of current flow through said microbridge, wherein said microbridge has a cross section normal to the direction of current flow through said microbridge which is greater than the superconducting coherence length and less than 7 $\mu$m, wherein said microbridge comprises a mesa projecting away from said first layer and extending to said second layer, said mesa having unexposed side surfaces which are contacted by and surrounded by said insulating layer, and said mesa projects away from said first layer by an amount which is greater than 5 nm and less than 1 $\mu$m.

33. A superconductive junction comprising:
a first superconductive oxide layer epitaxial with a substrate;
a second superconductive oxide layer epitaxial with said first layer;
a superconductive microbridge of superconductive oxide material epitaxial with said first and second layers and electrically connecting said first and second layers; and
an insulating layer extending between said first and second layers and being bridged by said microbridge, wherein said first and second layers have anisotropic superconductive properties and said first and second layers are substantially single crystal, with the longest crystallographic lattice repeat vector of the layers substantially normal to the planar interface between said substrate and said first layer, and wherein said microbridge has a cross section normal to the direction of current flow through said microbridge which is greater than the superconducting coherence length and less than 7 $\mu$m, and wherein said insulating layer comprises an insulating material, doped or undoped, which has similar lattice parameters to that superconductive oxide material of said first and second layers to as to promote epitaxial growth of said second superconductive layer.

34. A superconductive junction according to claim 29 wherein said superconductive oxide material comprises a rare earth barium copper oxide; and wherein said insulator material comprises a material selected from the group
(i) $PrBa_2Cu_3O_7$
(ii) $Y_2O_3$
(iii) $La_{1.5}Ba_{1.5}Cu_3O_7$ or
(iv) $CeO_2$;
and wherein said superconductive oxide material and said insulator material is doped or undoped.

* * * * *